(12) United States Patent
Bales

(10) Patent No.: US 8,018,274 B1
(45) Date of Patent: Sep. 13, 2011

(54) SWITCHED CAPACITOR AMPLIFIER CIRCUIT WITH CLAMPING

(75) Inventor: James Edward Bales, Fort Collins, CO (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 12/722,814

(22) Filed: Mar. 12, 2010

(51) Int. Cl.
*H03F 1/02* (2006.01)
(52) U.S. Cl. .......................... 330/9; 327/124
(58) Field of Classification Search ...... 330/9; 327/124, 327/307
See application file for complete search history.

(56) References Cited

U.S. PATENT DOCUMENTS

| | | | | |
|---|---|---|---|---|
| 6,853,241 | B2* | 2/2005 | Fujimoto | 330/9 |
| 6,897,720 | B2* | 5/2005 | Fujimoto | 330/9 |
| 7,463,087 | B2* | 12/2008 | Thiery | 330/9 |
| 7,834,685 | B1* | 11/2010 | Pertijs | 330/9 |

OTHER PUBLICATIONS

Maxim Integrated Products, Inc.; Application Note 1023, Understanding Pipelined ADCs; Mar. 1, 2001; 8 pages.

* cited by examiner

*Primary Examiner* — Henry K Choe (57) ABSTRACT

A system comprises a switched capacitor amplifier including an operational amplifier (opamp). A switching circuit comprises a first switch connected across inputs of the opamp. A second switch is connected across outputs of the opamp. An overdrive detect circuit communicates with the first and second switches and selectively shorts the inputs and the outputs of the opamp when the input voltage is greater than a first predetermined overdrive voltage or when the input voltage is less than a second predetermined overdrive voltage.

22 Claims, 8 Drawing Sheets

| Input Voltage | MDAC Code | OD Code | C5p MDAC Caps | C5m MDAC Caps | MDAC Residue Voltage | 12-Bit Output Code |
|---|---|---|---|---|---|---|
| $V_{IN} < -1.25$ | 100 | 1 | 0 to $V_{REF}^+$ / 4 to $V_{REF}^-$ | 4 to $V_{REF}^+$ / 0 to $V_{REF}^-$ | 0 (clamped) | 0 |
| $-1.25 < V_{IN} < -1.00$ | 100 | 0 | 0 to $V_{REF}^+$ / 4 to $V_{REF}^-$ | 4 to $V_{REF}^+$ / 0 to $V_{REF}^-$ | $2*(V_{IN} - 1.0)$ | 0 |
| $-1.00 < V_{IN} < -0.75$ | 100 | 0 | 0 to $V_{REF}^+$ / 4 to $V_{REF}^-$ | 4 to $V_{REF}^+$ / 0 to $V_{REF}^-$ | $2*(V_{IN} - 1.0)$ | 0-511 |
| $-0.75 < V_{IN} < -0.25$ | 000 | 0 | 1 to $V_{REF}^+$ / 3 to $V_{REF}^-$ | 3 to $V_{REF}^+$ / 1 to $V_{REF}^-$ | $2*(V_{IN} + 0.5)$ | 512-1535 |
| $-0.25 < V_{IN} < 0.25$ | 001 | 0 | 2 to $V_{REF}^+$ / 2 to $V_{REF}^-$ | 2 to $V_{REF}^+$ / 2 to $V_{REF}^-$ | $2*(V_{IN})$ | 1536-2559 |
| $+0.25 < V_{IN} < +0.75$ | 010 | 0 | 3 to $V_{REF}^+$ / 1 to $V_{REF}^-$ | 1 to $V_{REF}^+$ / 3 to $V_{REF}^-$ | $2*(V_{IN} - 0.5)$ | 2560-3583 |
| $+0.75 < V_{IN} < +1.00$ | 011 | 0 | 4 to $V_{REF}^+$ / 0 to $V_{REF}^-$ | 0 to $V_{REF}^+$ / 4 to $V_{REF}^-$ | $2*(V_{IN} - 1.0)$ | 3584-4095 |
| $+1.00 < V_{IN} < +1.25$ | 011 | 0 | 4 to $V_{REF}^+$ / 0 to $V_{REF}^-$ | 0 to $V_{REF}^+$ / 4 to $V_{REF}^-$ | $2*(V_{IN} - 1.0)$ | 4095 |
| $+1.25 < V_{IN}$ | 011 | 1 | 4 to $V_{REF}^+$ / 0 to $V_{REF}^-$ | 0 to $V_{REF}^+$ / 4 to $V_{REF}^-$ | 0 (clamped) | 4095 |

$V_{REF}^+ = +0.5V$
$V_{REF}^- = -0.5V$

FIG. 9

SWITCHED CAPACITOR AMPLIFIER CIRCUIT WITH CLAMPING

FIELD

The present disclosure relates to switched capacitor amplifier circuits and more particularly to switched capacitor amplifier circuits with clamping.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Switched capacitor amplifier circuits may be used in a wide variety of applications. Switched capacitor amplifier circuits may encounter gain errors due to a signal overdrive condition. When an operational transconductance amplifier (OTA) in the switched-capacitor amplifier circuit is overdriven, it may require several clock cycles to return to a desired operating point. During the intervening recovery period, output signal errors may occur. Some conventional switched capacitor amplifier circuits clamp an input signal, which may introduce signal distortion in the desired signal range.

SUMMARY

A system comprises a switched capacitor amplifier including an operational amplifier (opamp). A switching circuit comprises a first switch connected across inputs of the opamp. A second switch is connected across outputs of the opamp. An overdrive detect circuit communicates with the first and second switches and selectively shorts the inputs and the outputs of the opamp when the input voltage is greater than a first predetermined overdrive voltage or when the input voltage is less than a second predetermined overdrive voltage.

In other features, the switched capacitor amplifier comprises a first plurality of capacitors having first terminals that communicate with one of the inputs of the opamp. A second plurality of capacitors includes first terminals that communicate with another one of the inputs of the opamp. The switched capacitor amplifier further comprises a first plurality of switches that selectively connect second terminals of the first plurality of capacitors to one of a positive terminal of the input voltage, a positive terminal of a reference voltage and a negative terminal of a reference voltage. A second plurality of switches selectively connect second terminals of the second plurality of capacitors to one of a negative terminal of the input voltage, the positive terminal of the reference voltage and the negative terminal of the reference voltage.

In other features, the switched capacitor amplifier comprises a first circuit that receives an input signal and that generates switch control signals for the first and second plurality of switches and a first code signal. The first circuit comprises a plurality of comparators that receive a plurality of voltage references, respectively, and the input voltage. A decoder generates switching signals for the first and second plurality of switches and the first code signal based on outputs of the plurality of comparators.

In other features, the switched capacitor amplifier comprises a first capacitor including a first terminal connected to one of the inputs of the opamp and a second terminal connected to one of the outputs of the opamp. A second capacitor includes a first terminal connected to another one of the inputs of the opamp and a second terminal connected to another one of the outputs of the opamp. The overdrive detect circuit comprises a first comparator including one input that receives the first predetermined overdrive voltage and another input that receives the input voltage. A second comparator includes one input that receives the second predetermined overdrive voltage and another input that receives the input voltage. A logic gate receives outputs of the first and second comparators and generates an output that controls the switching circuit.

In other features, the first predetermined overdrive voltage is a positive voltage and the second predetermined overdrive voltage is a negative voltage.

In other features, a pipelined analog to digital converter comprises a plurality of stages. A first one of the plurality of stages comprises the system. A flash analog to digital converter communicates with a last one of the plurality of stages. An alignment and digital error correction circuit communicates with the plurality of stages and the flash analog to digital converter.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

A clamping circuit according to the present disclosure provides improved overdrive recovery even when overdrive conditions occur frequently. The quick overdrive recovery tends to enhance system performance. The switch capacitor amplifier circuit with clamping according to the present disclosure will be described below in conjunction with a multiplying digital to analog converter (MDAC) stage of a pipelined analog to digital converter (ADC). However, skilled artisans will appreciate that the switched capacitor amplifier circuit according to the present disclosure may be used in other circuits.

Figure 1:
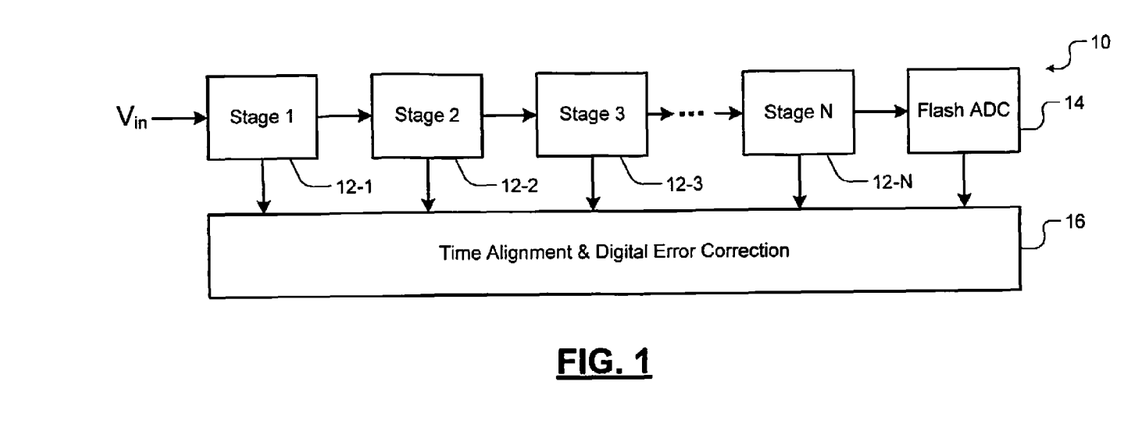
FIG. 1 is a functional block diagram of a pipelined ADC according to the present disclosure.
Figure 2:
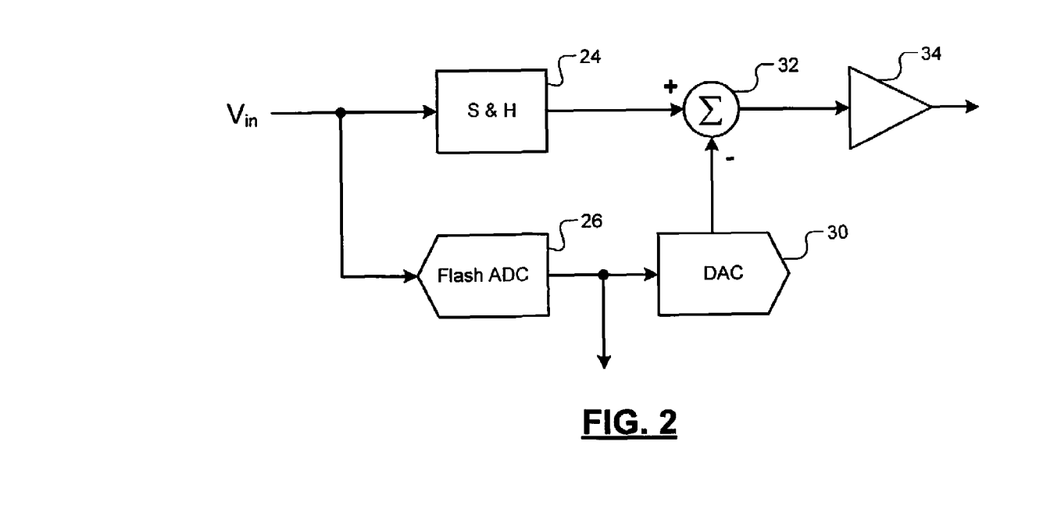
FIG. 2 is a functional block diagram of one of the stages of the pipelined ADC according to the present disclosure.

Referring now to FIGS. 1 and 2, a pipelined analog to digital converter (ADC) 10 includes multiple stages 12-1, 12-2, 12-3, ..., and 12-N (collectively stages 12). Each of the stages 12 is used to determine subsets of the bits. The last stage 12-N communicates with a flash ADC 14. The stages 12 and the flash ADC 14 communicate with an alignment and digital error correction circuit 16, which corrects for latency caused by the delays of the stages 12. The pipelined ADC 10 converts the analog input signal to a T bit output, where T and N are integers and T>N. For example only, T may be set equal to 12 and N may be set equal to 4 in some implementations.

Each of the stages 12 includes a sample and hold circuit 24, a flash ADC 26, a digital to analog converter (DAC) 30, a summing circuit 32 and an amplifier circuit 34. As will be described further below, the sample and hold circuit 24, the DAC 30, the summing circuit 32 and the amplifier circuit 34 in the stages 12 may be implemented by a MDAC with a switched capacitor amplifier circuit according to the present disclosure.

The analog input $V_{in}$ is sampled and held by the sample and hold circuit 24. The flash ADC 26 quantizes the analog input $V_{in}$ to M bits, where M may be set equal to T/N. For example only, M may be set equal to 3 in some implementations. The output of the flash ADC 26 is then fed to the DAC 30 (which may be accurate to about T bits). The analog output is subtracted from the input at the summing circuit 32.

The residue voltage is amplified by the amplifier circuit 34 and fed to the stage 12-2. The amplifier 34 may have a gain. For example only, the gain may be set to 2 in some implementations. The gained-up residue voltage continues to another stage of the pipeline ADC 10, which provides M bits per stage. The flash ADC 14 may resolve some of the LSB bits. For example only, the flash ADC 14 may resolve 4 LSBs in some implementations.

Because the M bits from each stage 12 are determined at different points in time, all of the bits corresponding to the same sample of $V_{in}$ are time-aligned by shift registers before being fed to time alignment and digital error correction circuit 16. When one of the stages 12 finishes processing a sample, determining the bits, and passing the residue voltage to the next stage, the stage 12 can start processing the next sample received from the sample and hold circuit 24 of the stage 12. This pipelining action improves throughput.

Figure 3:
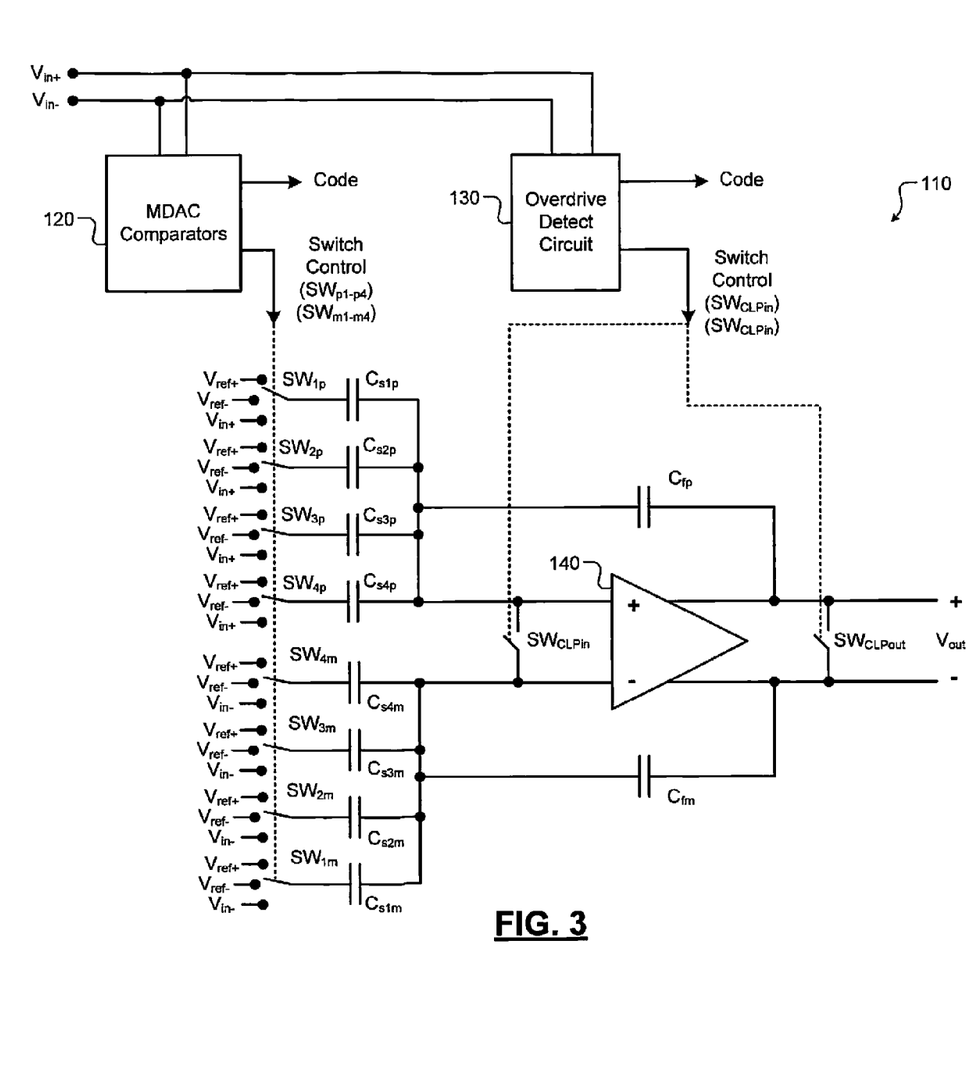
FIG. 3 is a functional block diagram of a switched capacitor amplifier circuit according to the present disclosure.

Referring now to FIG. 3, a switched capacitor amplifier circuit 110 with clamping according to the present disclosure is shown. The switched capacitor amplifier circuit 110 includes sampling capacitors $C_S$. For example only, the number of sampling capacitors may be set equal to $2*2^M$. In the example in FIG. 3, M=2 and 8 capacitors are provided, including $C_{s1p}$, $C_{s2p}$, $C_{s3p}$ and $C_{s4p}$ and $C_{s1m}$, $C_{s2m}$, $C_{s3m}$ and $C_{s4m}$. The switched capacitor amplifier 110 further includes switches $SW_{1p}$, $SW_{2p}$, $SW_{3p}$ and $SW_{4p}$ that selectively switch terminals of the capacitors $C_{s1p}$, $C_{s2p}$, $C_{s3p}$ and $C_{s4p}$ to a positive or negative terminal of a reference voltage $V_{ref}$ or a positive terminal of an input voltage V. The switched capacitor amplifier 110 further includes switches $SW_{1m}$, $SW_{2m}$, $SW_{3m}$ and $SW_{4m}$ that selectively switch the capacitors $C_{s1m}$, $C_{s2m}$, $C_{s3m}$ and $C_{s4m}$ to the positive or negative terminal of the reference voltage $V_{ref}$ or a negative terminal of the input voltage $V_{in}$.

The switched capacitor amplifier 110 further includes a multiplying DAC (MDAC) comparator circuit 120 that receives the input voltage $V_{in}$ and that generates an MDAC code signal and switch control signals for switching the switches $SW_{1m}$, $SW_{2m}$, $SW_{3m}$ and $SW_{4m}$ and $SW_{1p}$, $SW_{2p}$, $SW_{3p}$ and $SW_{4p}$. The switched capacitor amplifier 110 further includes an overdrive OD detect circuit 130 that receives the input voltage $V_{in}$ and that generates an OD code signal and switch control signals for clamping switches $SW_{CLPin}$ and $SW_{CLPout}$.

The switched capacitor amplifier 110 further includes an operational transconductance amplifier (OTA) 140. The OTA 140 includes a non-inverting input that communicates with second terminals of the capacitors $C_{s1p}$, $C_{s2p}$, $C_{s3p}$ and $C_{s4p}$ and an inverting input that communicates with second terminals of the capacitors $C_{s1m}$, $C_{s2m}$, $C_{s3m}$ and $C_{s4m}$. Feedback capacitor $C_{fp}$ communicates with the non-inverting input and output of the OTA 140. Feedback capacitor $C_{fn}$ communicates with the inverting input and output of the OTA 140. Input clamping switch $SW_{CLPin}$ communicates with the non-inverting and inverting inputs of the OTA 140. Output clamping switch $SW_{CLPout}$ communicates with the non-inverting and inverting outputs of the OTA 140.

When the stages 12 are overdriven, it may take several clock cycles for the OTA 140 to provide the nominal level of accuracy. In some applications, this may result in system performance degradation. This problem is sometimes addressed by clamping the input signal before it is applied to the ADC in the stage 12. This type of clamping may impose penalties of power consumption and/or signal distortion. A clamping circuit according to the present disclosure provides overdrive recovery (the next clock cycle gain phase provides full accuracy) without distorting the signal and with minimal power dissipation.

Figure 4A:
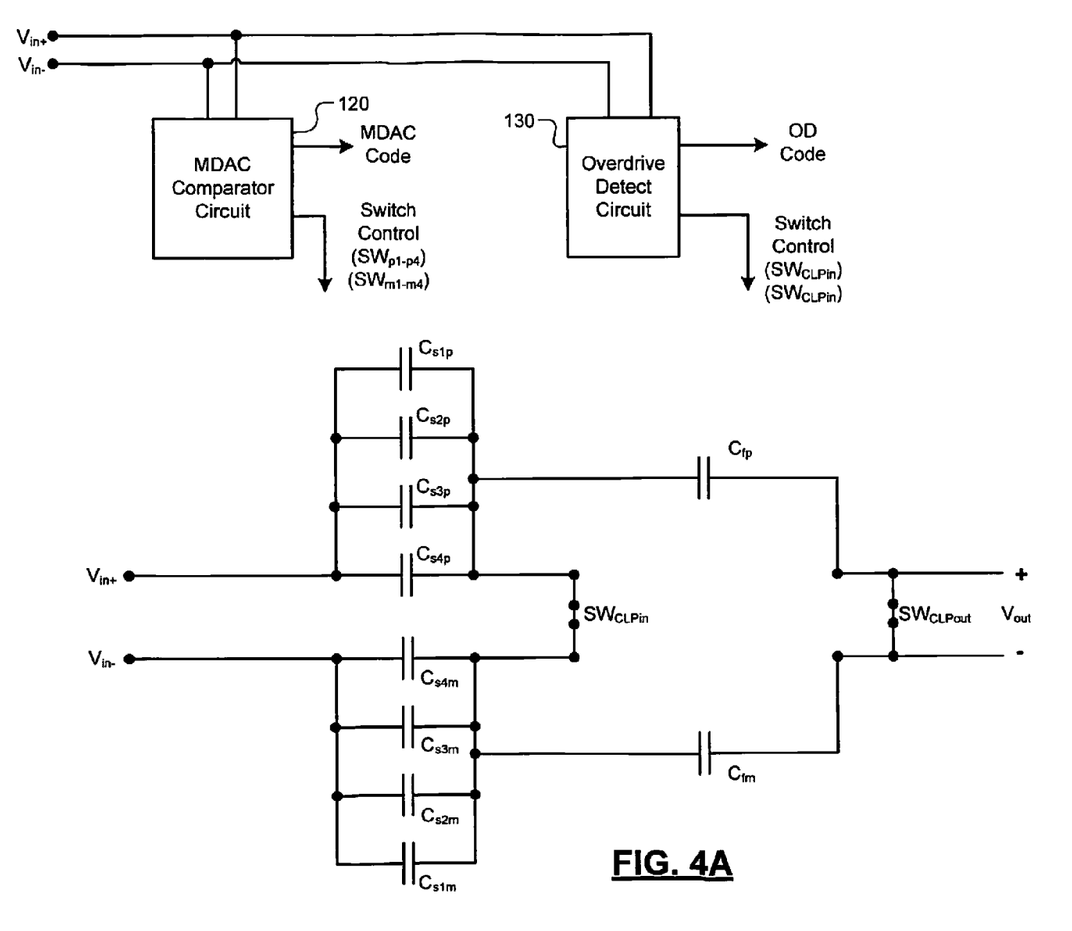
FIGS. 4A and 4B are functional block diagrams and electrical schematics of the switched capacitor amplifier circuit of FIG. 3 in a sampling phase.

Referring now to FIG. 4A, the switched capacitor amplifier circuit 110 is shown in a sample phase. The switch control signals from the MDAC comparator circuit 120 connect first terminals of the capacitors $C_{s1p}$, $C_{s2p}$, $C_{s3p}$ and $C_{s4p}$ to a positive terminal of the input signal V. The switch control signals from the MDAC comparator circuit 120 connect the first terminals of the capacitors $C_{s1m}$, $C_{s2m}$, $C_{s3m}$ and $C_{s4m}$ to a negative terminal of the input signal $V_{in}$. The overdrive detect circuit 130 generates the switch control signals to position the switches $SW_{CLPin}$ and $SW_{CLPout}$ in closed positions, which effectively shorts the OTA 140 (omitted from FIG. 4A).

During the sampling phase of the clock cycle, the input signal $V_{in}$ is sampled. The input signal $V_{in}$ is applied across the input sampling capacitors $C_{s1p}$, $C_{s2p}$, $C_{s3p}$ and $C_{s4p}$ and $C_{s1m}$, $C_{s2m}$, $C_{s3m}$ and $C_{s4m}$ while the feedback capacitors $C_{fp}$ and $C_{fn}$ are reset to zero. At the same time as the sampling phase, the MDAC comparator circuit 120 makes a quantizer decision. The overdrive detect circuit 130 detects whether or not the signal exceeds overdrive thresholds.

Figure 4B:
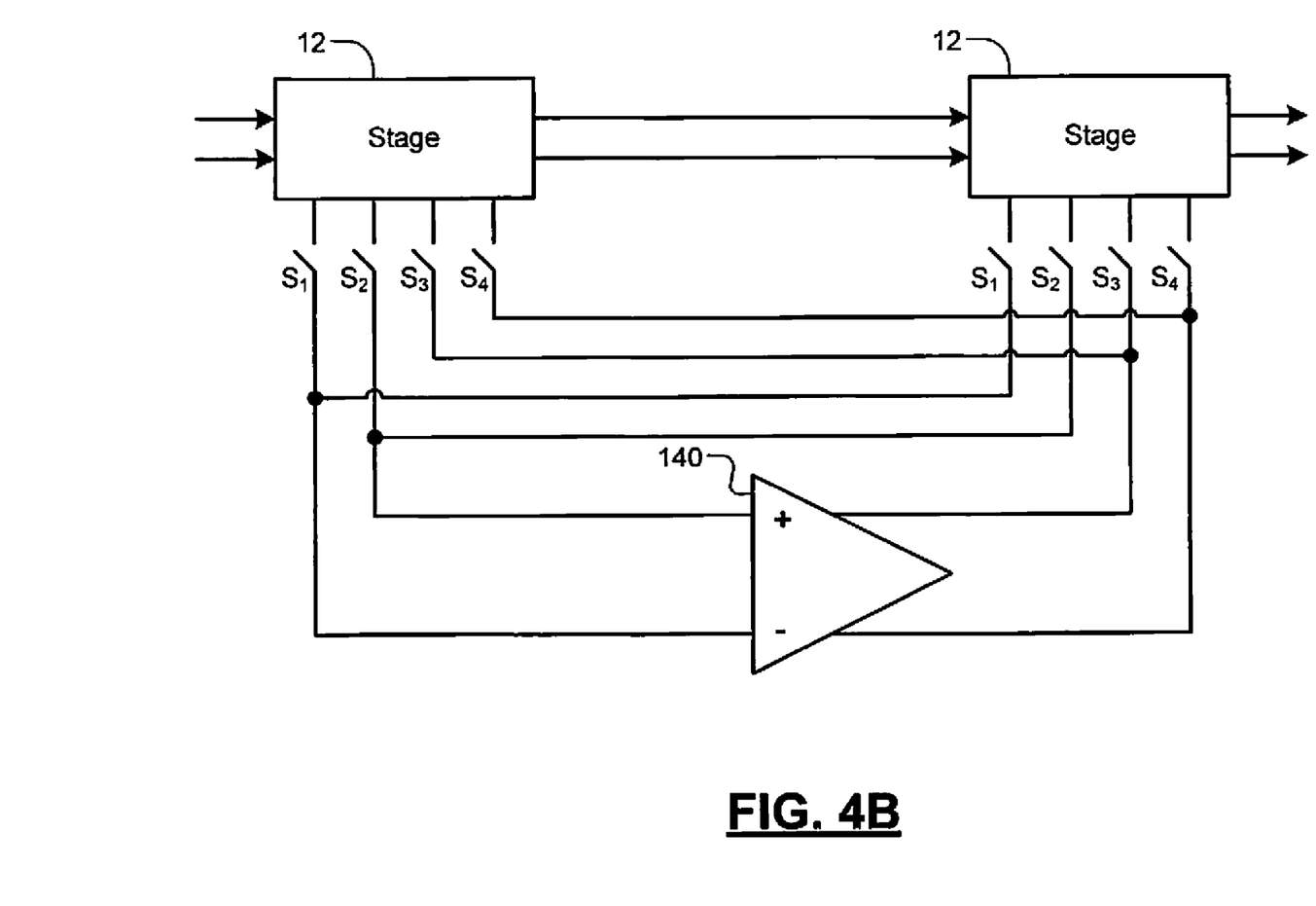

During the sampling phase, the OTA 140 may be active as the amplifier for a subsequent MDAC stage. In other words, the OTA 140 may be switched and shared with another stage. For example only in FIG. 4B, switches $S_1$ to $S_4$ can be used to switch the OTA 140 between the stages 12 that are operating in opposite phases. As can be appreciated, other components from FIG. 4A are omitted for purposes of clarity.

Figure 5:
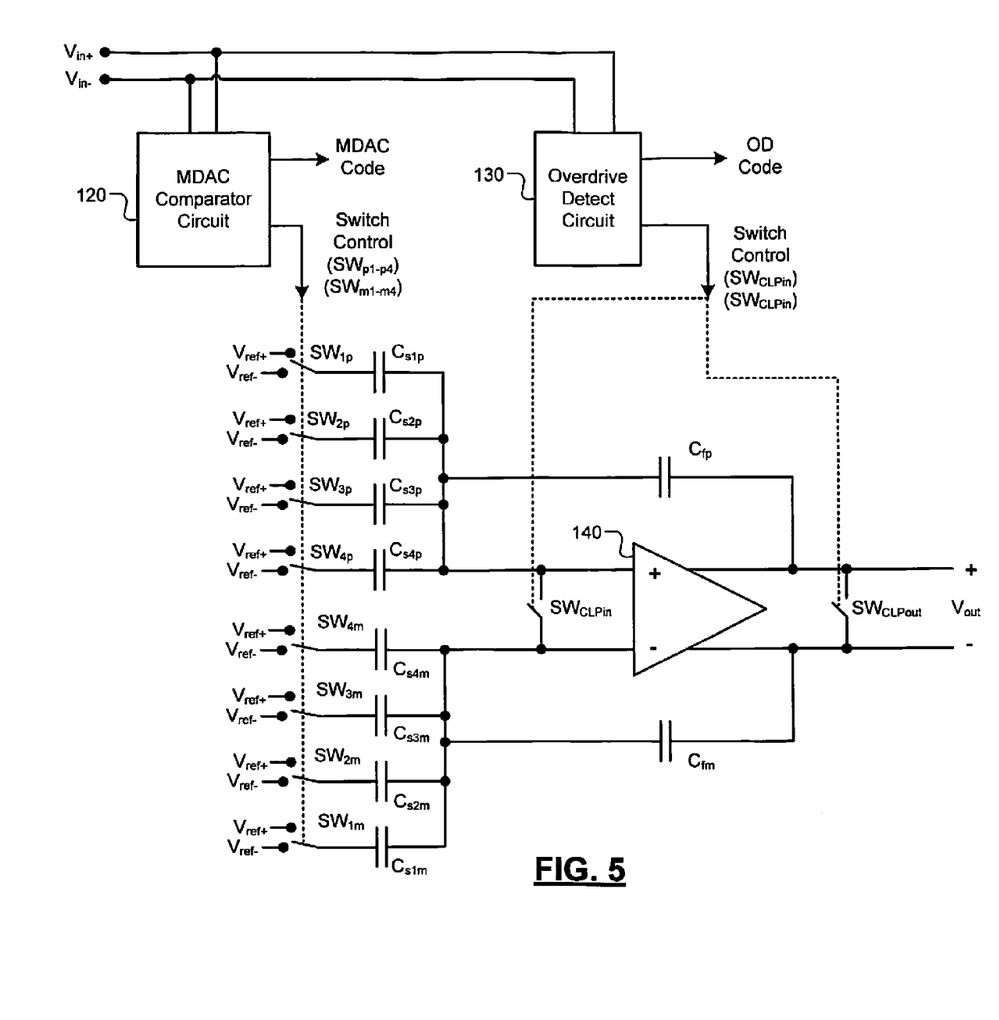
FIG. 5 is a functional block diagram and electrical schematic of the switched capacitor amplifier circuit of FIG. 4A in an amplifying phase.

Following sampling of the input signal $V_{in}$, the MDAC is placed in the amplify phase as shown in FIG. 5. The switched capacitor amplifier circuit 110 is shown in an amplifying phase. The switch control signals from the MDAC comparator circuit 120 position the switches $SW_{1p}$, $SW_{2p}$, $SW_{3p}$, $SW_{4p}$, $SW_{1m}$, $SW_{2m}$, $SW_{3m}$ and $SW_{4m}$ based on the quantizer decision to connect the first terminals of the capacitors $C_{s1p}$, $C_{s2p}$, $C_{s3p}$, $C_{s4p}$, $C_{s1m}$, $C_{s2m}$, $C_{s3m}$ and $C_{s4m}$ to the positive or negative terminal of the reference voltage $V_{ref}$. The clamping switches $SW_{CLPin}$ and $SW_{CLPout}$ may be opened or closed as will be described below.

In the amplifying phase, the capacitors $C_{s1m}$, $C_{s2m}$, $C_{s3m}$ and $C_{s4m}$ and $C_{s1p}$, $C_{s2p}$, $C_{s3p}$ and $C_{s4p}$ are connected to reference potentials in a configuration that is determined by the quantizer decision. If an overdrive condition is detected, the clamp switches $SW_{CLPin}$ and $SW_{CLPout}$ are closed. If the overdrive condition is not detected when the input signal $V_{in}$ was sampled, the clamp switches $SW_{CLPin}$ and $SW_{CLPout}$ remain open and charge is transferred to satisfy forcing potentials ($V_{ref}+/-$) and OTA gain, which results in a residue output $V_{OUT}$. This is the normal operation that occurs when the overdrive detection and clamping are not performed. In other implementations, the clamp switches $SW_{CLPin}$ and $SW_{CLPout}$ are used when clamping is needed and additional switches (not shown) may be placed in parallel with $SW_{CLPin}$ and $SW_{CLPout}$. The additional switches may be low impedance switches that are closed during the sampling phase (instead of the clamp switches $SW_{CLPin}$ and $SW_{CLPout}$) and opened otherwise. Additional switches may also be used to reset the capacitors $C_{fp}$ and $C_{fm}$.

If an overdrive condition is detected when the input signal $V_{in}$ is sampled, the switches $SW_{CLPin}$ and $SW_{CLPout}$ are closed. This forces the differential input and output of the OTA 140 to zero. Charge on the sampling capacitors is redistributed to satisfy the forcing potentials ($V_{ref}+/-$) and the zero volt (low impedance) condition at the inputs of the OTA 140. Depending on whether the overdrive polarity was positive or negative, the charge on the capacitors $C_{s1p}$, $C_{s2p}$, $C_{s3p}$ and $C_{s4p}$ and $C_{s1m}$, $C_{s2m}$, $C_{s3m}$ and $C_{s4m}$ and the OTA operating point will be exactly the same as if a positive or negative full scale signal was sampled. Here the clamp is shunting the feedback.

The clamp switch $SW_{CLPout}$ forces the output to zero since random offsets in the OTA 140 would otherwise force the output into saturation since the feedback loop is broken. Since the OTA 140 is maintained at a valid operating point, it does not need to recover from an overdrive condition and will provide the nominal gain accuracy on the next clock cycle. The switches $SW_{CLPin}$ and $SW_{CLPout}$ can be very small and have negligible effect on normal operation.

The overdrive detection circuit 130 also provides a digital output which allows the alignment digital error correction circuit 16 to properly clamp the digital output. Since the switch $SW_{CLPout}$ forces the MDAC output to zero, the composite output at the end of the pipeline has a digital value near full scale. Due to analog offsets, the digital output might be less than full scale, which would appear as a valid signal. The OD code output by the overdrive detection circuit 130 is used to force digital clamping to full scale.

Figure 6:
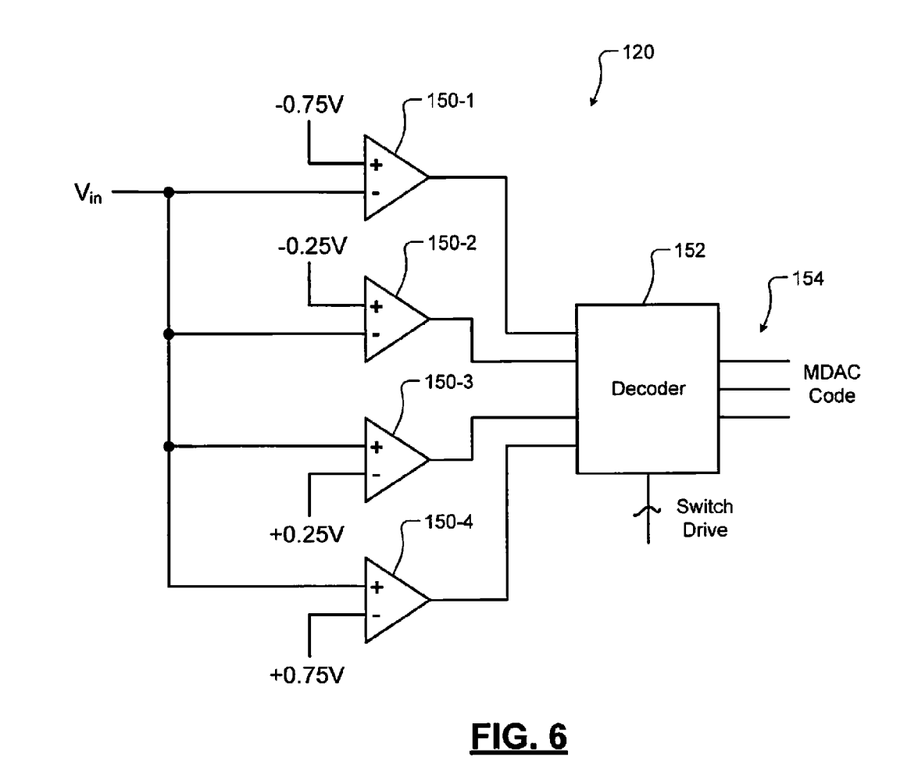
FIG. 6 is a functional block diagram and electrical schematic of an exemplary implementation of a comparator circuit.

Referring now to FIG. 6, an exemplary implementation of the MDAC comparator circuit 120 is shown for a 1.0V, 12-bit ADC. The MDAC comparator circuit 120 includes comparators 150-1, 150-2, 150-3 and 150-4 (collectively comparators 150) that receive the input voltage $V_{in}$ and reference voltages. For the comparators 150-1 and 150-2, the input voltage $V_{in}$ is connected to the inverting input and the non-inverting inputs receive -0.75V and -0.25V, respectively. For the comparators 150-3 and 150-4, the input voltage $V_{in}$ is connected to the non-inverting input and the inverting inputs receive +0.25V and +0.75V, respectively. Outputs of the comparators 150 are input to a decoder 152, which provides a 2-bit output 154 that will be described further in FIGS. 8 and 9.

Figure 7:
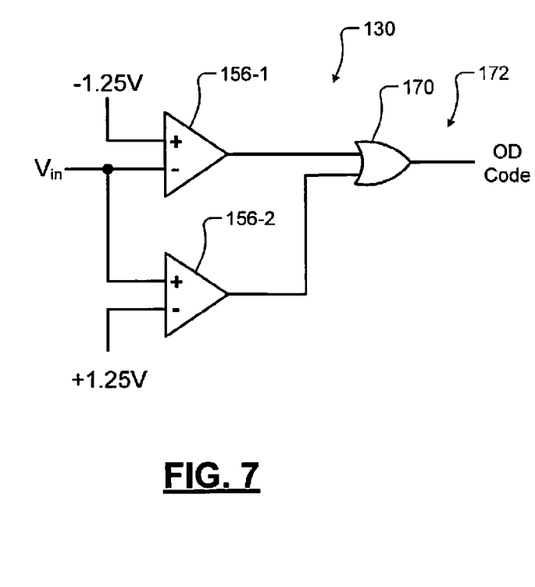
FIG. 7 is a functional block diagram and electrical schematic of an exemplary overdrive detect circuit.

Referring now to FIG. 7, an exemplary implementation of the overdrive detect circuit 130 is shown. The overdrive detect circuit 130 includes comparators 156-1 and 156-2 that receive the input voltage $V_{in}$ at inverting and non-inverting inputs, respectively. The comparators 156-1 and 156-2 receive reference voltages of -1.25V and +1.25V at non-inverting and inverting inputs, respectively. Outputs of the comparators 156 are input to a logic gate 170 such as an OR gate. An output 172 of the logic gate 170 generates the OD code.

Figure 8:
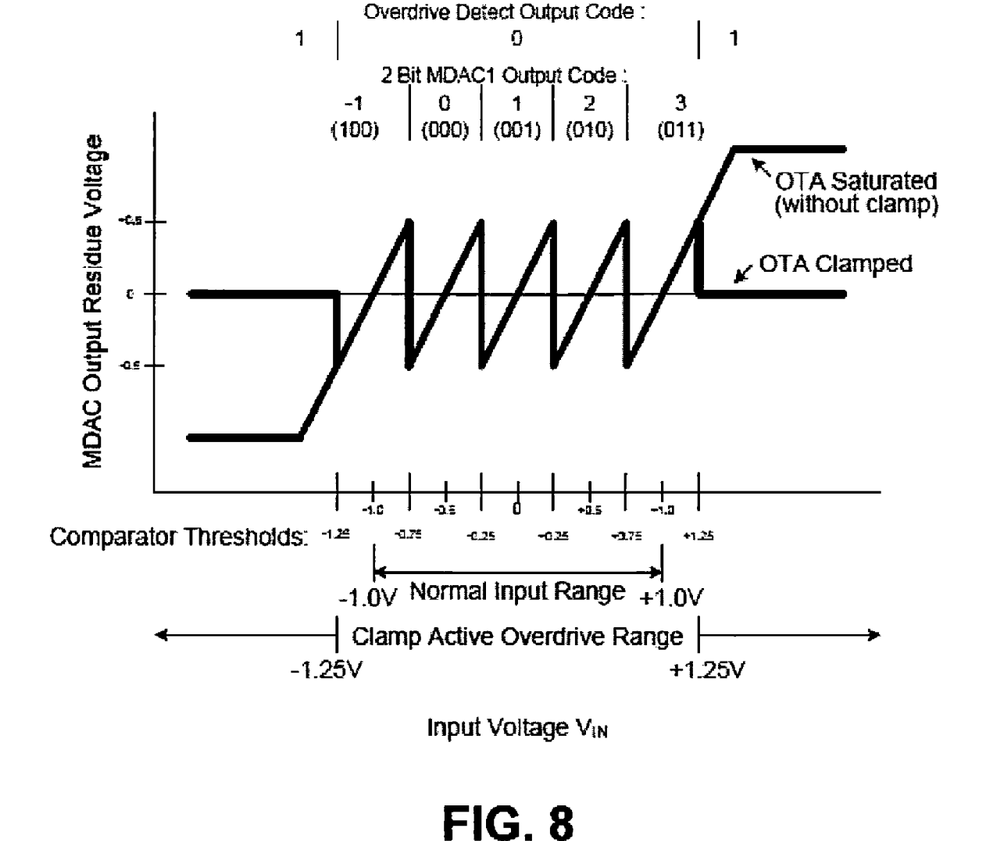
FIG. 8 is a graph illustrating residue voltage as a function of input voltage for an exemplary implementation.
Figure 9:
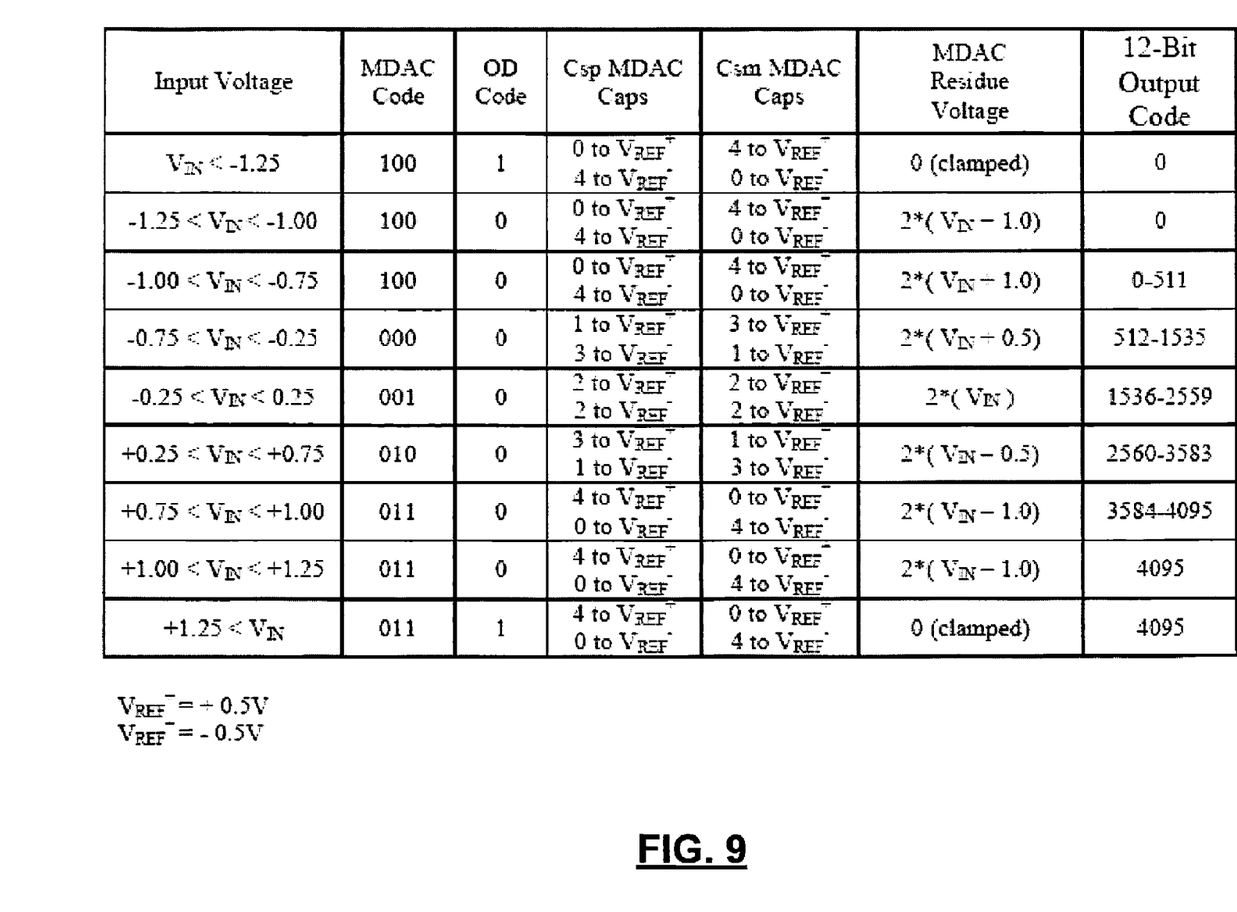
FIG. 9 is a chart relating input voltages, MDAC and OD codes, residue voltages, switching, and output codes for the exemplary implementation of FIG. 8.

Referring now to FIGS. 8 and 9, additional operating details for the exemplary implementation are shown. In FIG. 8, residue voltage is shown as a function of input voltage. In FIG. 9, input voltage ranges, MDAC and OD codes, capacitor switching details, residue voltages and output codes are shown.

As can be appreciated, the stage 12 with clamping may be the first stage of the pipelined analog to digital converter. The subsequent stages 12 do not need to have clamp circuits since the overdrive voltage will be handled by the first stage.

The broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. A system comprising:
   a switched capacitor amplifier including an operational amplifier (opamp);
   a switching circuit comprising:
      a first switch connected across inputs of the opamp; and
      a second switch connected across outputs of the opamp;
   an overdrive detect circuit that communicates with the first and second switches and that selectively shorts the inputs and the outputs of the opamp when the input voltage is greater than a first predetermined overdrive voltage or when the input voltage is less than a second predetermined overdrive voltage.

2. The system of claim 1, wherein the switched capacitor amplifier comprises:
   a first plurality of capacitors having first terminals that communicate with one of the inputs of the opamp; and
   a second plurality of capacitors having first terminals that communicate with another one of the inputs of the opamp.

3. The system of claim 2, wherein the switched capacitor amplifier further comprises:
   a first plurality of switches that selectively connect second terminals of the first plurality of capacitors to one of a positive terminal of the input voltage, a positive terminal of a reference voltage and a negative terminal of a reference voltage; and
   a second plurality of switches that selectively connect second terminals of the second plurality of capacitors to one of a negative terminal of the input voltage, the positive terminal of the reference voltage and the negative terminal of the reference voltage.

4. The system of claim 3, wherein the switched capacitor amplifier comprises a first circuit that receives an input signal and that generates switch control signals for the first and second plurality of switches and a first code signal.

5. The system of claim 3, wherein the first circuit comprises:

a plurality of comparators that receive a plurality of voltage references, respectively, and the input voltage; and a decoder that generates switching signals for the first and second plurality of switches and the first code signal based on outputs of the plurality of comparators.

6. The system of claim 1, wherein the switched capacitor amplifier comprises:

a first capacitor including a first terminal connected to one of the inputs of the opamp and a second terminal connected to one of the outputs of the opamp; and a second capacitor including a first terminal connected to another one of the inputs of the opamp and a second terminal connected to another one of the outputs of the opamp.

7. The system of claim 1, wherein the overdrive detect circuit comprises:

a first comparator including one input that receives the first predetermined overdrive voltage and another input that receives the input voltage;

a second comparator including one input that receives the second predetermined overdrive voltage and another input that receives the input voltage; and a logic gate that receives outputs of the first and second comparators and that generates an output that controls the switching circuit.

8. The system of claim 1, wherein the first predetermined overdrive voltage is a positive voltage and the second predetermined overdrive voltage is a negative voltage.

9. A pipelined analog to digital converter, comprising a plurality of stages, wherein a first one of the plurality of stages comprises the system of claim 1.

10. The pipelined analog to digital converter of claim 9 further comprising:

a flash analog to digital converter that communicates with a last one of the plurality of stages; and an alignment and digital error correction circuit that communicates with the plurality of stages and the flash analog to digital converter.

11. The pipelined analog to digital converter of claim 9, wherein the opamp of the first one of the plurality of stages is shared with a second one of the plurality of stages.

12. A system comprising:

a switched capacitor amplifier including:

an operational amplifier (opamp) including inputs and outputs;

a first plurality of capacitors that communicate with one of the inputs of the opamp;

a second plurality of capacitors that communicate with another one of the inputs of the opamp;

a first capacitor connected across one of the inputs and one of the outputs of the opamp; and a second capacitor connected across another one of the inputs and another one of the outputs of the opamp; and a clamping circuit that selectively shorts the inputs and the outputs of the opamp when the input voltage is greater than a first predetermined overdrive voltage or when the input voltage is less than a second predetermined overdrive voltage.

13. The system of claim 12, wherein the clamping circuit comprises:

a switching circuit, and an overdrive detect circuit that selectively shorts the inputs and the outputs of the opamp using the switching circuit when the input voltage is greater than the first predetermined overdrive voltage or when the input voltage is less than the second predetermined overdrive voltage.

14. The system of claim 12, wherein the switched capacitor amplifier further comprises:

a first plurality of switches that selectively connect the first plurality of capacitors to one of a positive terminal of the input voltage, a positive terminal of a reference voltage and a negative terminal of a reference voltage; and a second plurality of switches that selectively connect the second plurality of capacitors to one of a negative terminal of the input voltage, the positive terminal of the reference voltage and the negative terminal of the reference voltage.

15. The system of claim 12, wherein the switched capacitor amplifier comprises a first circuit that receives an input signal and that generates switch control signals for the first and second plurality of switches and a first code signal.

16. The system of claim 15, wherein the first circuit comprises:

a plurality of comparators that receive a plurality of voltage references, respectively, and the input voltage; and a decoder that generates switching signals for the first and second plurality of switches and the first code signal based on outputs of the plurality of comparators.

17. The system of claim 13, wherein the overdrive detect circuit comprises:

a first comparator including one input that receives the first predetermined overdrive voltage and another input that receives the input voltage;

a second comparator including one input that receives the second predetermined overdrive voltage and another input that receives the input voltage; and a logic gate that receives outputs of the first and second comparators and that generates an output that controls the clamping circuit.

18. The system of claim 12, wherein the first predetermined overdrive voltage is a positive voltage and the second predetermined overdrive voltage is a negative voltage.

19. A pipelined analog to digital converter comprising a plurality of stages, wherein a first one of the plurality of stages comprises the system of claim 12.

20. The pipelined analog to digital converter of claim 19 further comprising a flash analog to digital converter that communicates with a last one of the plurality of stages.

21. The pipelined analog to digital converter of claim 20 further comprising an alignment and digital error correction circuit that communicates with the plurality of stages and the flash analog to digital converter.

22. The pipelined analog to digital converter of claim 19, wherein the opamp of the first one of the plurality of stages is shared with a second one of the plurality of stages.

* * * * *